(12) United States Patent
Yu

(10) Patent No.: US 11,083,096 B2
(45) Date of Patent: Aug. 3, 2021

(54) DISPLAY DEVICE

(71) Applicant: Au Optronics Corporation, Hsinchu (TW)

(72) Inventor: Ming-Hsuan Yu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/831,816

(22) Filed: Mar. 27, 2020

(65) Prior Publication Data

US 2021/0022256 A1 Jan. 21, 2021

Related U.S. Application Data

(60) Provisional application No. 62/874,677, filed on Jul. 16, 2019.

(30) Foreign Application Priority Data

Dec. 23, 2019 (TW) .................................. 108147136

(51) Int. Cl.

| | | |
|---|---|---|
| *G06F 1/16* | (2006.01) | |
| *H05K 5/00* | (2006.01) | |
| *H04M 1/02* | (2006.01) | |
| *H05K 5/02* | (2006.01) | |
| *H05K 7/20* | (2006.01) | |
| *G06F 1/20* | (2006.01) | |

(52) U.S. Cl.
CPC ........ *H05K 5/0017* (2013.01); *H04M 1/0268* (2013.01); *H05K 5/0226* (2013.01); *H05K 7/20145* (2013.01); *H05K 7/20172* (2013.01); *H05K 7/20972* (2013.01); *G06F 1/1626* (2013.01); *G06F 1/1681* (2013.01); *G06F 1/203* (2013.01)

(58) Field of Classification Search
None
See application file for complete search history.

(56) References Cited

U.S. PATENT DOCUMENTS

| 9,268,377 | B2* | 2/2016 | MacDonald | ............ G06F 1/206 |
| 9,557,771 | B2* | 1/2017 | Park | ...................... G06F 1/1641 |
| 9,952,631 | B2* | 4/2018 | Xin | ........................ G06F 1/1616 |
| 10,254,798 | B2 | 4/2019 | Fujimoto | |
| 10,747,277 | B2* | 8/2020 | Ku | ...................... H05K 7/20145 |
| 10,768,676 | B2* | 9/2020 | Liu | .......................... G06F 1/203 |
| 2006/0114653 | A1* | 6/2006 | Seto | ......................... G06F 1/203 |
| | | | | 361/695 |

(Continued)

FOREIGN PATENT DOCUMENTS

| CN | 105597933 | 5/2016 |
| CN | 107148602 | 9/2017 |

(Continued)

*Primary Examiner* — Courtney L Smith
(74) *Attorney, Agent, or Firm* — JCIPRNET

(57) ABSTRACT

A display device including a carrying main body, a flexible display panel and at least one fan is provided. The flexible display panel is disposed on the carrying main body and adapted to be unfolded on the carrying main body. A gap is formed between the flexible display panel and the carrying main body. The fan is disposed on the carrying main body and adapted to generate an airflow, and a flow path of the airflow is located at the gap.

18 Claims, 17 Drawing Sheets

(56) References Cited

U.S. PATENT DOCUMENTS

| | | | |
|---|---|---|---|
| 2013/0021762 A1* | 1/2013 | van Dijk | H05K 5/0226 |
| | | | 361/749 |
| 2013/0077241 A1* | 3/2013 | Senatori | G06F 1/203 |
| | | | 361/694 |
| 2015/0124398 A1* | 5/2015 | Kirkpatrick | H05K 7/20136 |
| | | | 361/679.48 |
| 2017/0090516 A1* | 3/2017 | Ku | G06F 1/1669 |
| 2017/0322598 A1 | 11/2017 | Fujimoto | |
| 2018/0004254 A1* | 1/2018 | Park | G06F 1/1652 |
| 2018/0184545 A1* | 6/2018 | Degner | H05K 7/2039 |
| 2018/0324964 A1* | 11/2018 | Yoo | E05D 3/18 |

FOREIGN PATENT DOCUMENTS

| | | |
|---|---|---|
| CN | 206619053 | 11/2017 |
| CN | 208316809 | 1/2019 |

\* cited by examiner

DISPLAY DEVICE

CROSS-REFERENCE TO RELATED APPLICATION

This application claims the priority benefit of U.S. provisional application Ser. No. 62/874,677, filed on Jul. 16, 2019 and Taiwan patent application serial no. 108147136, filed on Dec. 23, 2019. The entirety of each of the above-mentioned patent applications is hereby incorporated by reference and made a part of this specification.

BACKGROUND

Technical Field

The disclosure relates to a display device, and particularly relates to a display device including a flexible display panel.

Description of Related Art

Along with development of a display panel manufacturing process, the manufacturing technology of flexible display panels gradually becomes mature, so that the flexible display panels are popular in consumer products. The flexible display panel may be applied to foldable electronic devices, such as foldable mobile phones and tablet computers, where the flexible display panel is disposed on two bodies of the electronic device at the same time and may be bent together with the two bodies which are being folded or unfolded.

Under such configuration, parts of the flexible display panel are overlapped with a hinge located between the two bodies, and a gap is formed between the hinge and the flexible display panel. Since the flexible display panel is configured to be flexible rather than fixed on the two bodies, it is difficult to completely cover the gap, and dust and particles outside the electronic device may easily enter the gap. On the other hand, in some foldable electronic devices, in order to allow the two bodies and the flexible display panel to be unfolded and folded smoothly, the flexible display panel and one of the bodies are designed to be relatively slidable, such that static electricity is generated due to friction between the flexible display panel and the body, thus resulting in a fact that dust and particles are easily adsorbed in the gap. Moreover, in order to provide sufficient space for the flexible display panel to be bent, some foldable electronic devices are provided with accommodation recesses in the bodies, and dust and particles are also likely to be accumulated in the accommodation recesses.

Moreover, the flexible display panel may also be applied to large-sized display devices, such as flat-screen televisions and so on, where the flexible display panel characterized by flexibility may be rolled up and accommodated into a base of the display device. Such configuration may also lead to static electricity generated due to relative sliding of the base and the flexible display panel during the process of unfolding or rolling up the flexible display panel, so that dust and particles are adsorbed and accumulated in the gap between the flexible display panel and the base.

SUMMARY

The disclosure is directed to a display device, which is capable of avoiding dust accumulation between a flexible display panel and a body.

An embodiment of the disclosure provides a display device including a carrying main body, a flexible display panel, and at least one fan. The flexible display panel is disposed on the carrying main body and is adapted to be unfolded on the carrying main body. A gap is formed between the flexible display panel and the carrying main body. The fan is disposed on the carrying main body and is adapted to generate an airflow, and a flow path of the airflow is located at the gap.

An embodiment of the disclosure provides a display device including a carrying main body, a flexible display panel, and at least one fan. The flexible display panel is disposed on the carrying main body and is adapted to be unfolded on the carrying main body. A gap is formed between the flexible display panel and the carrying main body. The fan is disposed on the carrying main body. An air outlet of the fan faces the gap.

In an embodiment of the disclosure, the carrying main body includes two bodies pivotally connected to each other, one part of the flexible display panel is arranged on one of the two bodies and the other part of the flexible display panel is arranged on the other one of the two bodies, and the flexible display panel is adapted to be unfolded on the two bodies while the two bodies are relatively unfolded and is adapted to be folded between the two bodies while the two bodies are relatively folded.

In an embodiment of the disclosure, the carrying main body further includes a hinge, the two bodies are pivotally connected to each other through the hinge, and the gap is at least partially formed between the flexible display panel and the hinge.

In an embodiment of the disclosure, a side surface of each of the two bodies faces the hinge, the fan is disposed on at least one of the two bodies, and an air outlet of the fan is located on the side surface.

In an embodiment of the disclosure, the gap has at least one open end at at least one axial end of the hinge, and the open end communicates with an external space of the display device, the fan includes at least one airflow guiding structure, and an airflow guiding direction of the airflow guiding structure is toward the open end.

In an embodiment of the disclosure, each of the bodies includes a main body and a position limiting flange, the position limiting flange extends along a partial peripheral edge of the main body, a partial peripheral edge of the flexible display panel is limited between the position limiting flange and the main body, and the gap is at least partially formed between the partial peripheral edge of the flexible display panel and the main body and between the partial peripheral edge of the flexible display panel and the position limiting flange.

In an embodiment of the disclosure, each of the bodies has a carrying surface, the carrying surface faces the flexible display panel, the fan is disposed on at least one of the two bodies, and an air outlet of the fan is located on the carrying surface and corresponds to the partial peripheral edge of the flexible display panel.

In an embodiment of the disclosure, each of the bodies has an accommodation recess, the accommodation recess faces the flexible display panel, the flexible display panel folded between the two bodies is partially located in the accommodation recess, and the gap is at least partially formed between the flexible display panel and the accommodation recess.

In an embodiment of the disclosure, the carrying main body includes a base and a lifting assembly, the lifting assembly is disposed on the base in a liftable manner, and two ends of the flexible display panel are respectively connected to the base and the lifting assembly, the flexible display panel is adapted to be rolled up in the base or unfolded between the base and the lifting assembly while the lifting assembly ascends or descends relative to the base, the base has an open slot, the flexible display panel rolled up in the base is adapted to move toward an external space of the base through the open slot, and the gap is at least partially formed between the flexible display panel and an inner wall of the open slot.

In an embodiment of the disclosure, the fan is an ion fan.

Based on the above description, the fan is configured with the air outlet facing the gap located between the flexible display panel and the carrying main body, so that the flow path of the airflow generated by the fan passes through the gap. Thereby, dust and particles are prevented from being accumulated in the gap through the airflow, and even if dust and particles are already accumulated in the gap, the dust and particles may be removed by the airflow. Therefore, the interior of the display device may be kept clean to prevent the flexible display panel from being scratched by dust and particles, and incapability of normally operating the display device due to accumulation of too much dust and particles inside the display device may be avoided.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
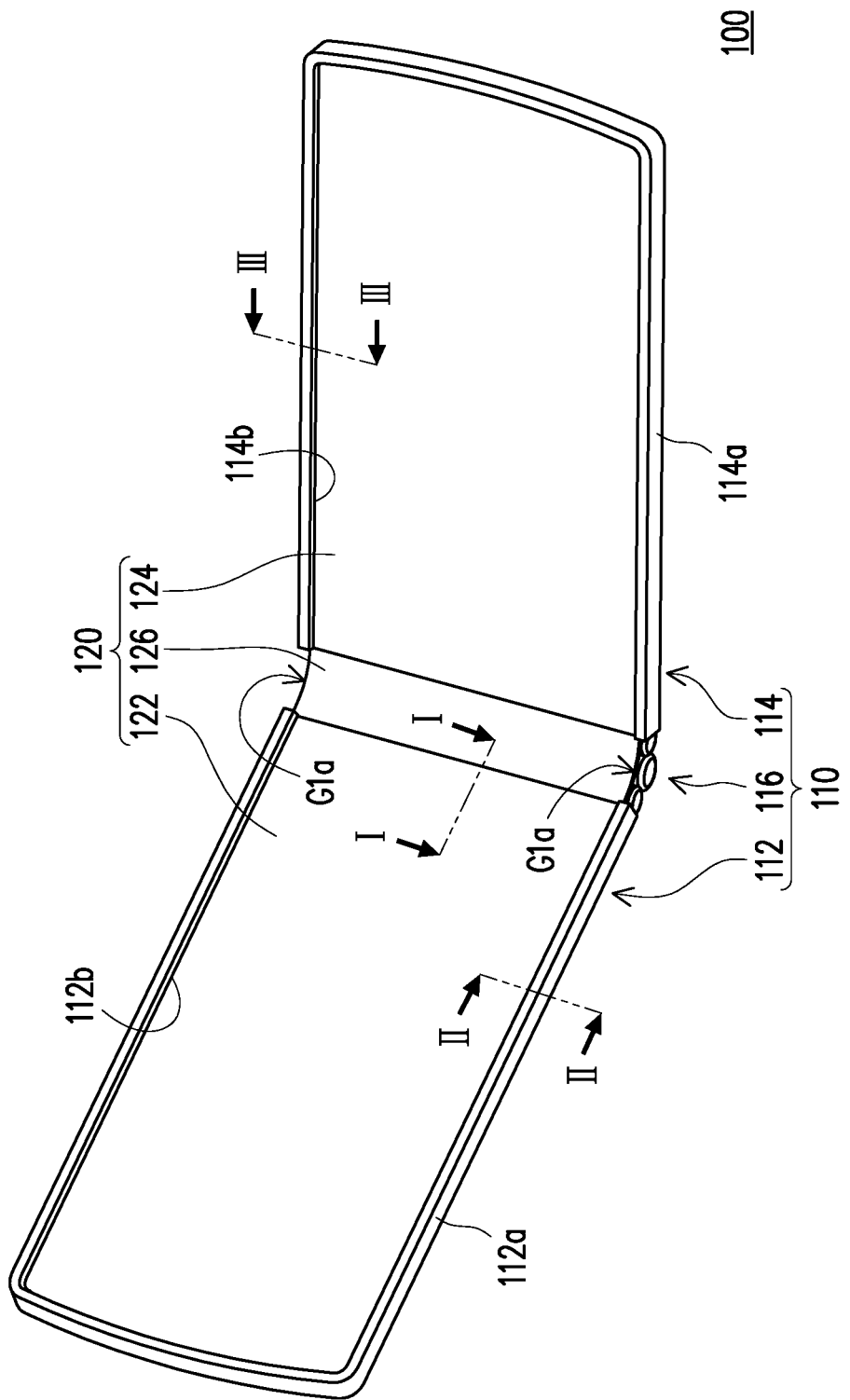
FIG. 1 is a three-dimensional view of a display device according to an embodiment of the disclosure.
Figure 2:
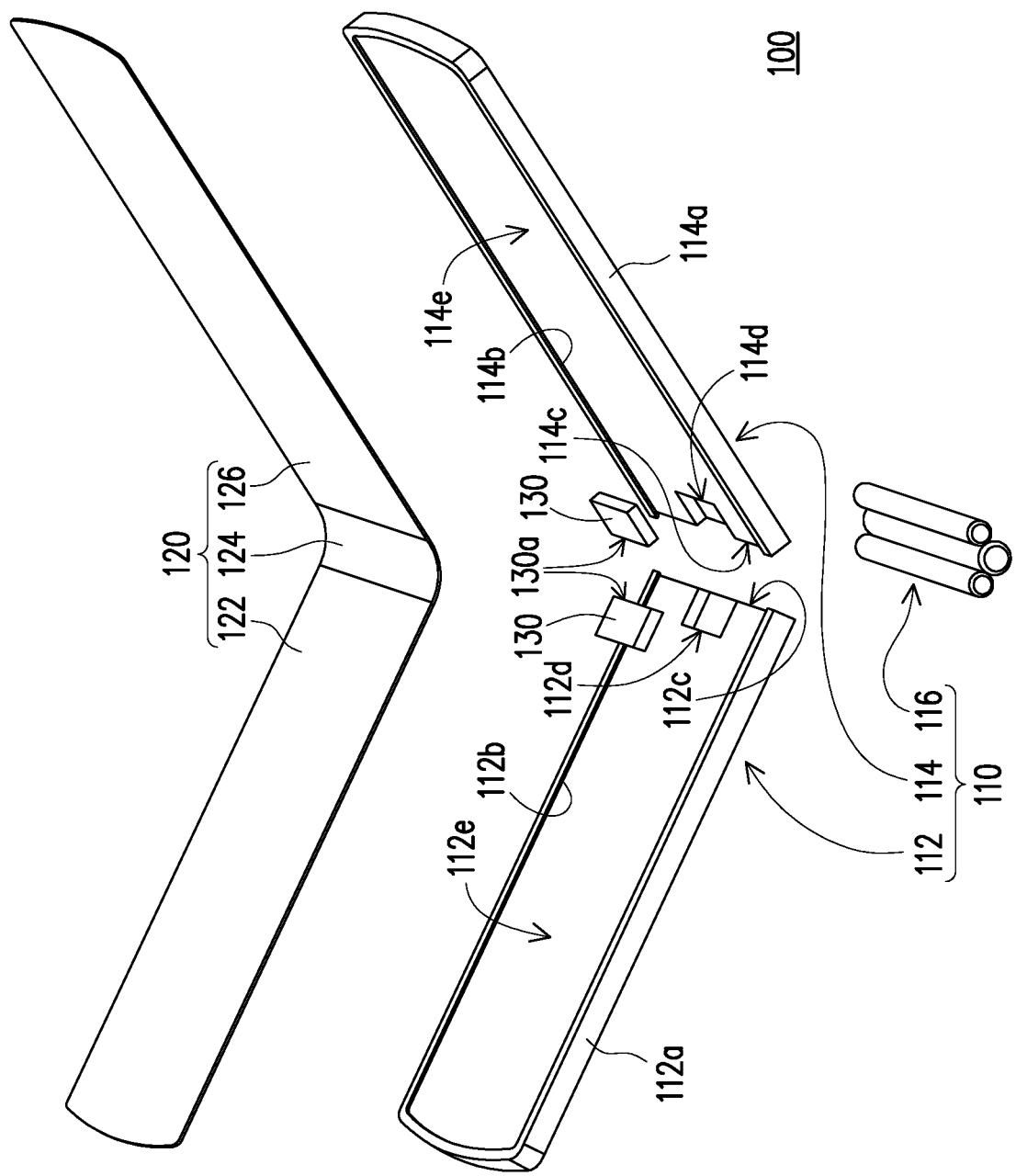
FIG. 2 is an exploded view of the display device in FIG. 1.
Figure 3:
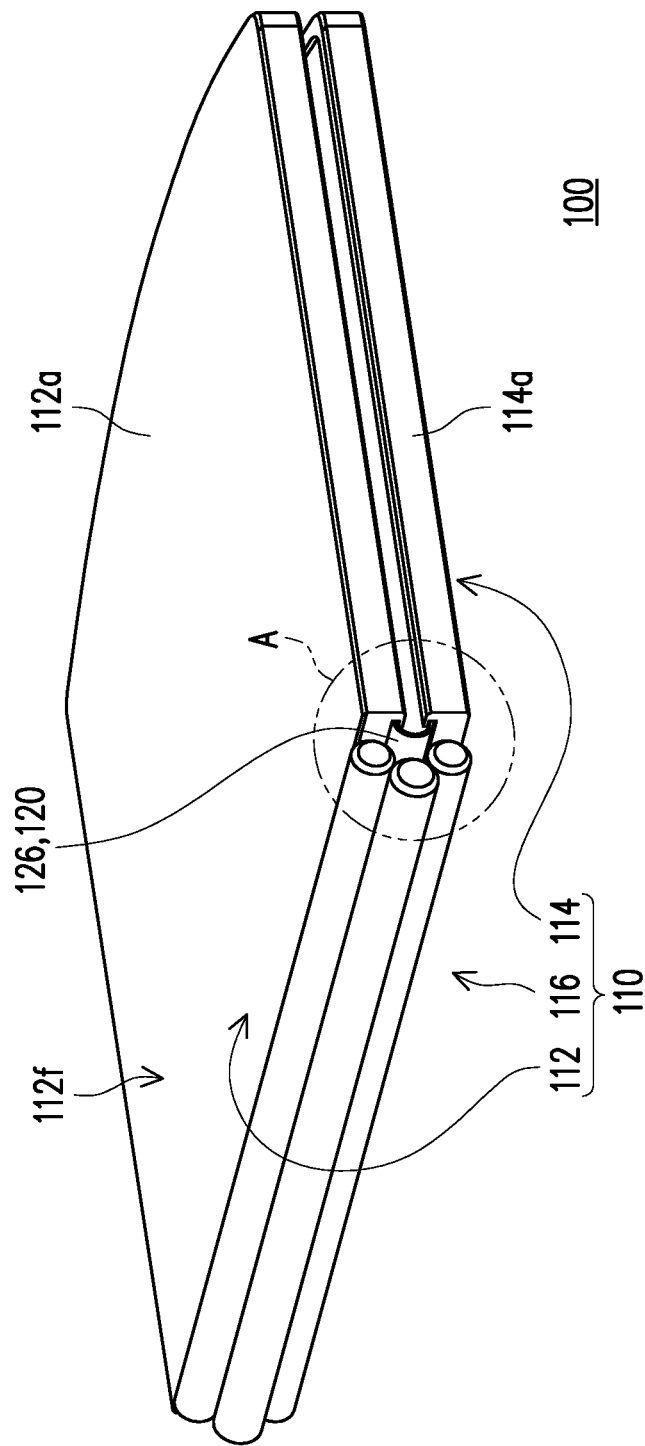
FIG. 3 illustrates a state of relatively folding the two bodies depicted in FIG. 1.

FIG. 1 is a three-dimensional view of a display device according to an embodiment of the disclosure. FIG. 2 is an exploded view of the display device in FIG. 1. FIG. 3 illustrates a state of relatively folding the two bodies depicted in FIG. 1. Referring to FIG. 1 to FIG. 3, a display device 100 of the embodiment is, for example, a smart phone or a tablet computer and includes a carrying main body 110 and a flexible display panel 120. The carrying main body 110 includes two bodies 112 and 114 pivotally connected to each other and a hinge 116, and the two bodies 112 and 114 are pivotally connected to each other through the hinge 116. One part of the flexible display panel 120 is arranged on the body 112 of the carrying main body 110, and the other part of the flexible display panel 120 is arranged on the body 114 of the carrying main body 110. The flexible display panel 120 is adapted to be unfolded on the two bodies 112 and 114 while the two bodies 112 and 114 are relatively unfolded, as shown in FIG. 1, and is adapted to be folded between the two bodies 112 and 114 while the two bodies 112 and 114 are relatively folded as shown in FIG. 3.

In detail, the flexible display panel 120 includes a first section 122, a second section 124 and a third section 126 as shown in FIG. 1 and FIG. 2, where the first section 122 is disposed on the body 112, the second section 124 is disposed on the body 114, and the third section 126 is connected between the first section 122 and the second section 124. The flexible display panel 120 is, for example, unfolded and folded while the third section 126 is bent. According to different display modes, the first section 122 and the second section 124 may respectively display different images, and the first section 122, the second section 124 and the third section 126 may also commonly display a single image.

Figure 4:
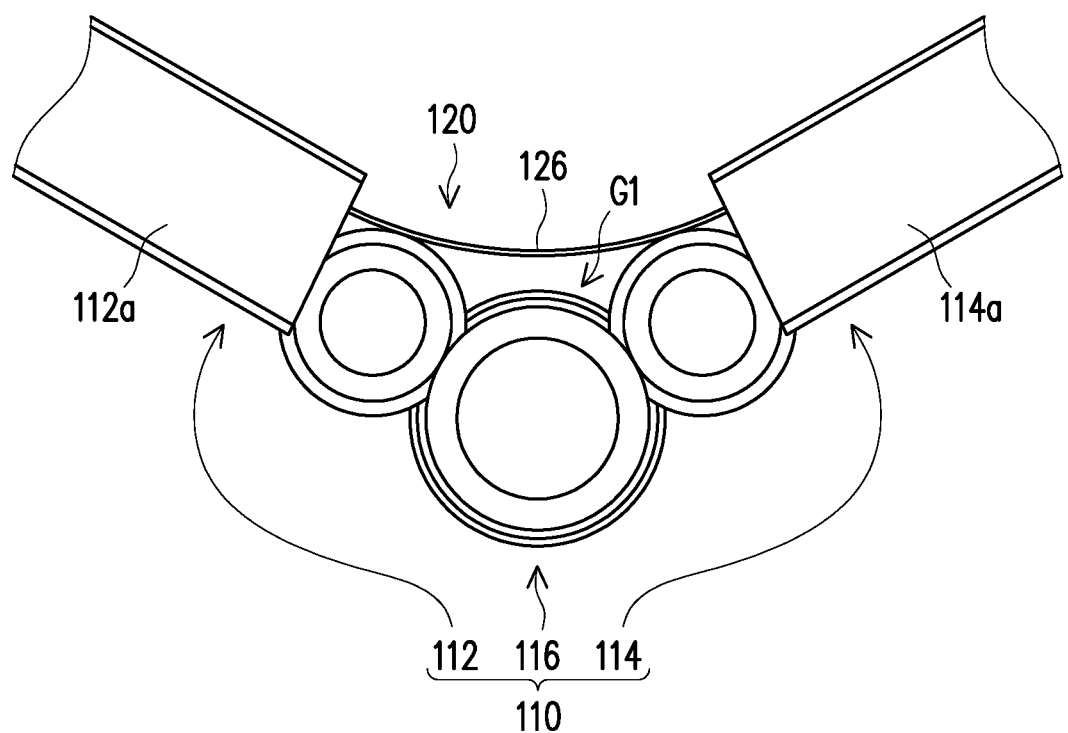
FIG. 4 is a partial side view of the display device in FIG. 1.
Figure 5:
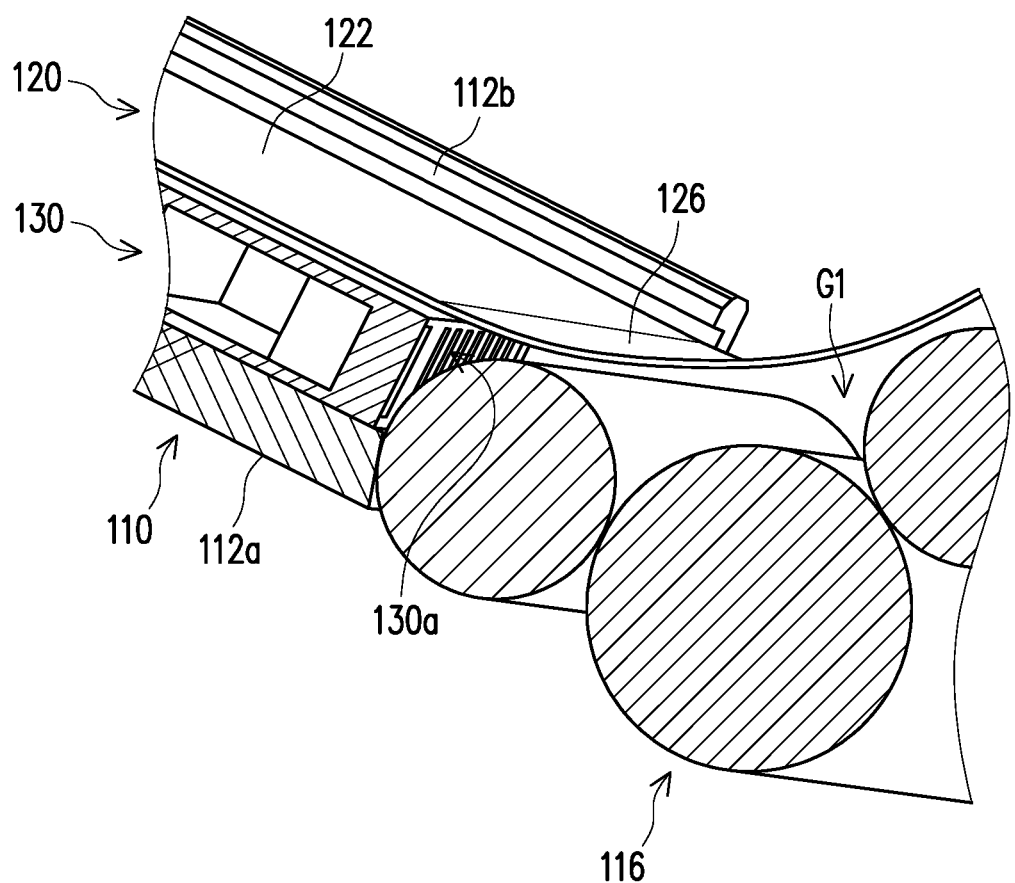
FIG. 5 illustrates a partial structure of the display device in FIG. 1.

FIG. 4 is a partial side view of the display device in FIG. 1. FIG. 5 illustrates a partial structure of the display device in FIG. 1, in which a cross-section corresponds to an I-I line in FIG. 1. As shown in FIG. 4 and FIG. 5, a gap G1 is formed between the flexible display panel 120 and the hinge 116 of the carrying main body 110. As described above, in order to prevent dust and particles from being adsorbed and accumulated in the gap G1 between the flexible display panel 120 and the hinge 116, the display device 100 of the embodiment includes at least one fan 130 (two fans are illustrated in FIG. 2) as shown in FIG. 2 and FIG. 5. The two fans 130 are respectively embedded in grooves 112d and 114d (indicated in FIG. 2) of the bodies 112 and 114 at places close to side surfaces 112c and 114c (indicated in FIG. 2) of the bodies 112 and 114 facing the hinge 116, and air outlets 130a of the two fans 130 are respectively located on the side surfaces 112c and 114c to face the gap G1, and the gap G1 is located on a flow path of airflows generated by the fans 130. Namely, the flow path of the airflows generated by the fans 130 is partially located at the gap G1. Thereby, dust and particles are prevented from being accumulated in the gap G1 through the airflows, and even if dust and particles are already accumulated in the gap G1, the dust and particles may be removed by the airflows.

Figure 6:
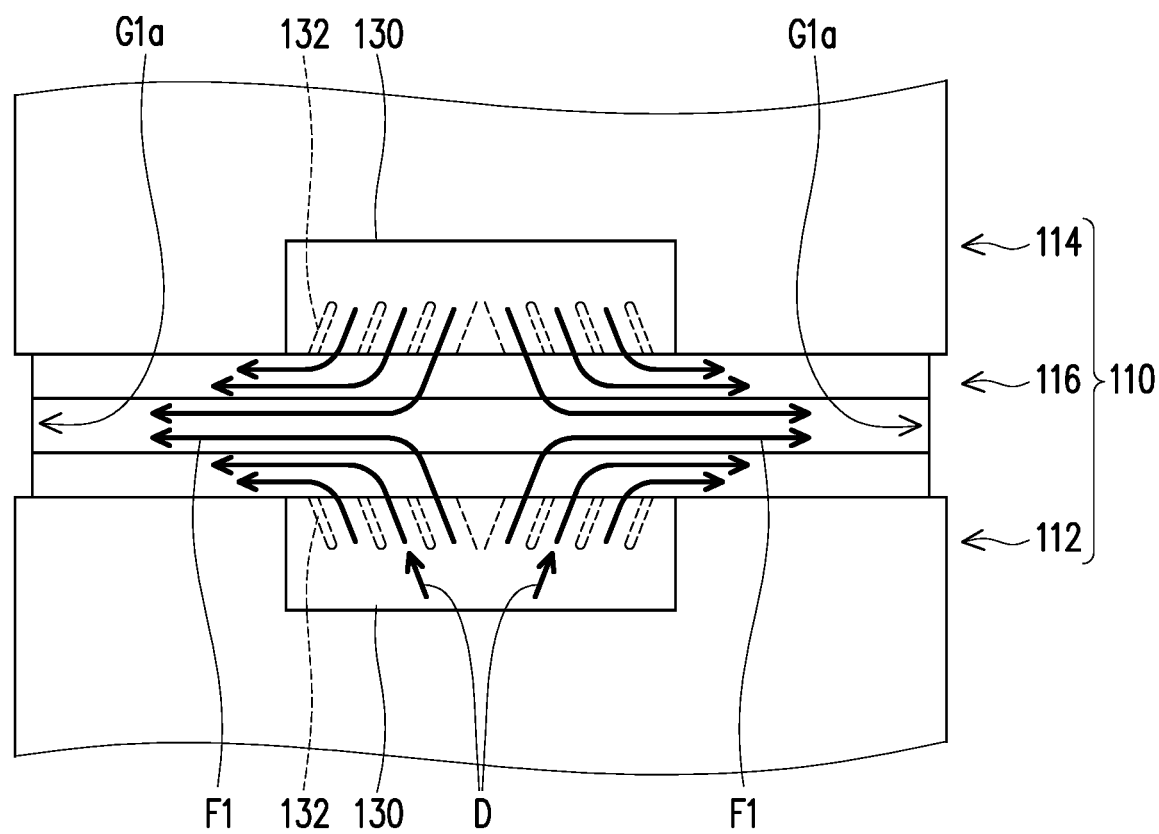
FIG. 6 is a partial structural schematic diagram of the display device in FIG. 1.

FIG. 6 is a partial structural schematic diagram of the display device in FIG. 1. Further, the gap G1 has open ends G1a (indicated in FIG. 1 and FIG. 6) at two axial ends of the hinge 116, and the open ends G1a communicate with an external space of the display device 100. Each of the fans 130 includes a plurality airflow guiding structures 132 as shown in FIG. 6, and an airflow guiding direction D of the airflow guiding structures 132 is toward the open ends G1a, such that the airflows F1 generated by the fans 130 may be guided by the airflow guide structures 132 to flow toward the open ends G1a and reach the external space of the display device 100 through the open ends G1a. Thereby, dust and particles are prevented from entering the gap G1 from the open ends G1a.

In the embodiment, a grid-shaped open slot may be provided on a back surface 112f (indicated in FIG. 3) of the body 112 to serve as an air inlet of the corresponding fan 130, or the air inlet and the air outlet 130a of the fan 130 may all be set on the side surface 112c of the body 112, which is not limited by the disclosure. The air inlet of the fan 130 corresponding to the body 114 is also, for example, configured in a similar manner. In addition, each fan 130 is, for example, an ion fan, and is suitable for generating an airflow with ions to achieve a function of eliminating static electricity, so as to efficiently remove dust and particles from the gap G1 by the ions and the airflow. However, the disclosure is not limited thereto, and the fans 130 may be any suitable form.

Figure 7:
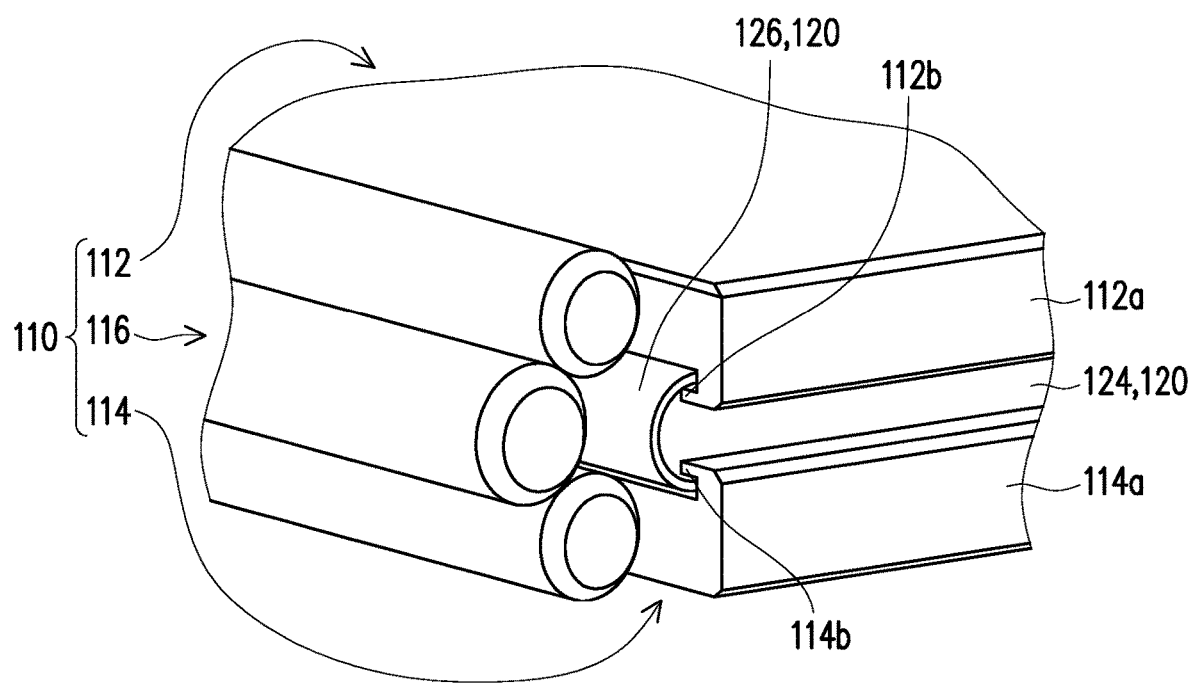
FIG. 7 is a partial enlarged view of a region A of a display device in FIG. 3.

FIG. 7 is a partial enlarged view of a region A of the display device in FIG. 3. Referring to FIG. 5 and FIG. 7, the body 112 of the embodiment includes a main body 112a and a position limiting flange 112b, the position limiting flange 112b approximately has a shape of an inverted U " " (shown in FIG. 1 and FIG. 2), and extends along a partial peripheral edge of the main body 112a, and a partial peripheral edge of the first section 122 of the flexible display panel 120 is limited between the position limiting flange 112b and the main body 112a. Similarly, the body 114 includes a main body 114a and a position limiting flange 114b, the position limiting flange 114b approximately has the shape of an inverted U (shown in FIG. 1 and FIG. 2), and extends along a partial peripheral edge of the main body 114a, and a partial peripheral edge of the second section 124 of the flexible display panel 120 is limited between the position limiting flange 114b and the main body 114a.

Figure 8:
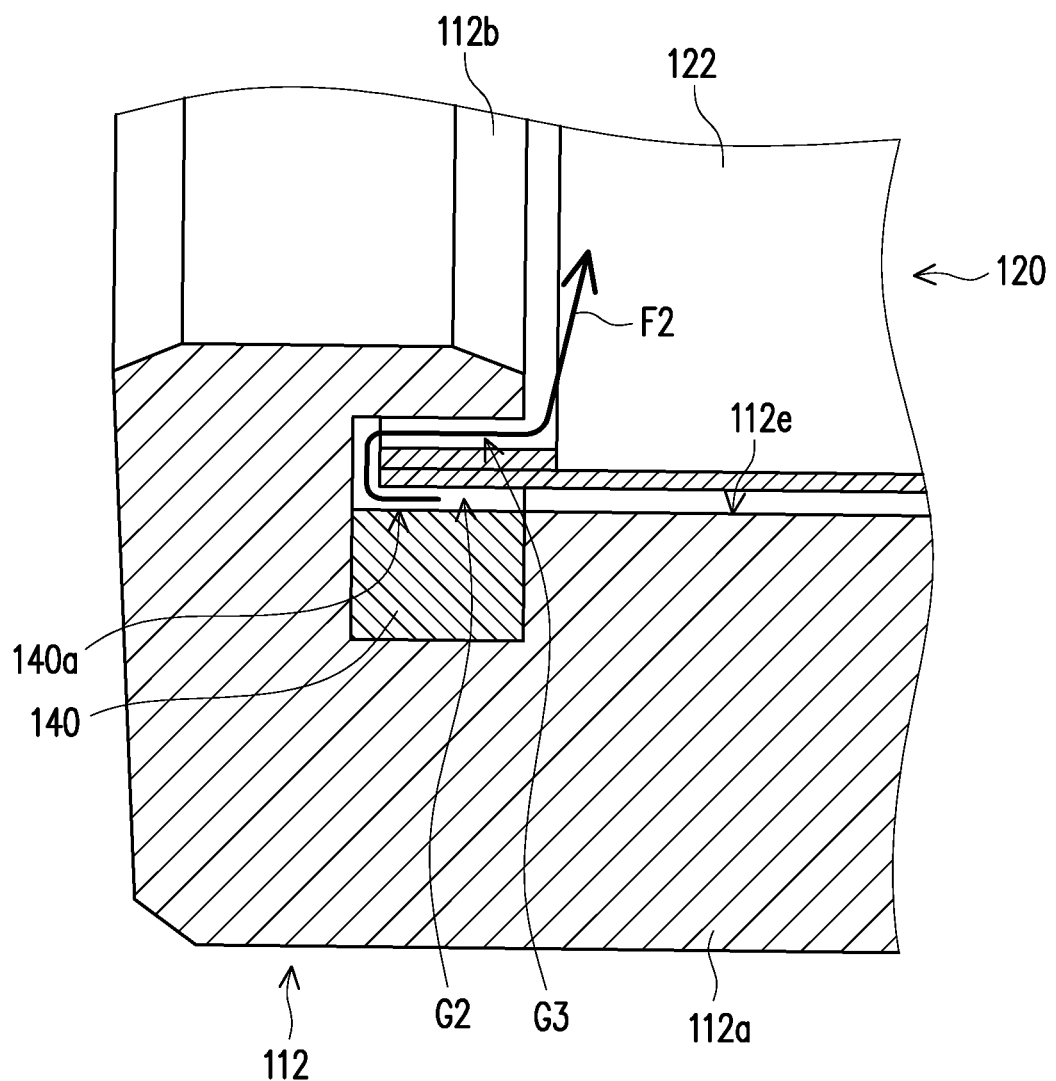
FIG. 8 illustrates a partial structure of the display device in FIG. 1.
Figure 9:
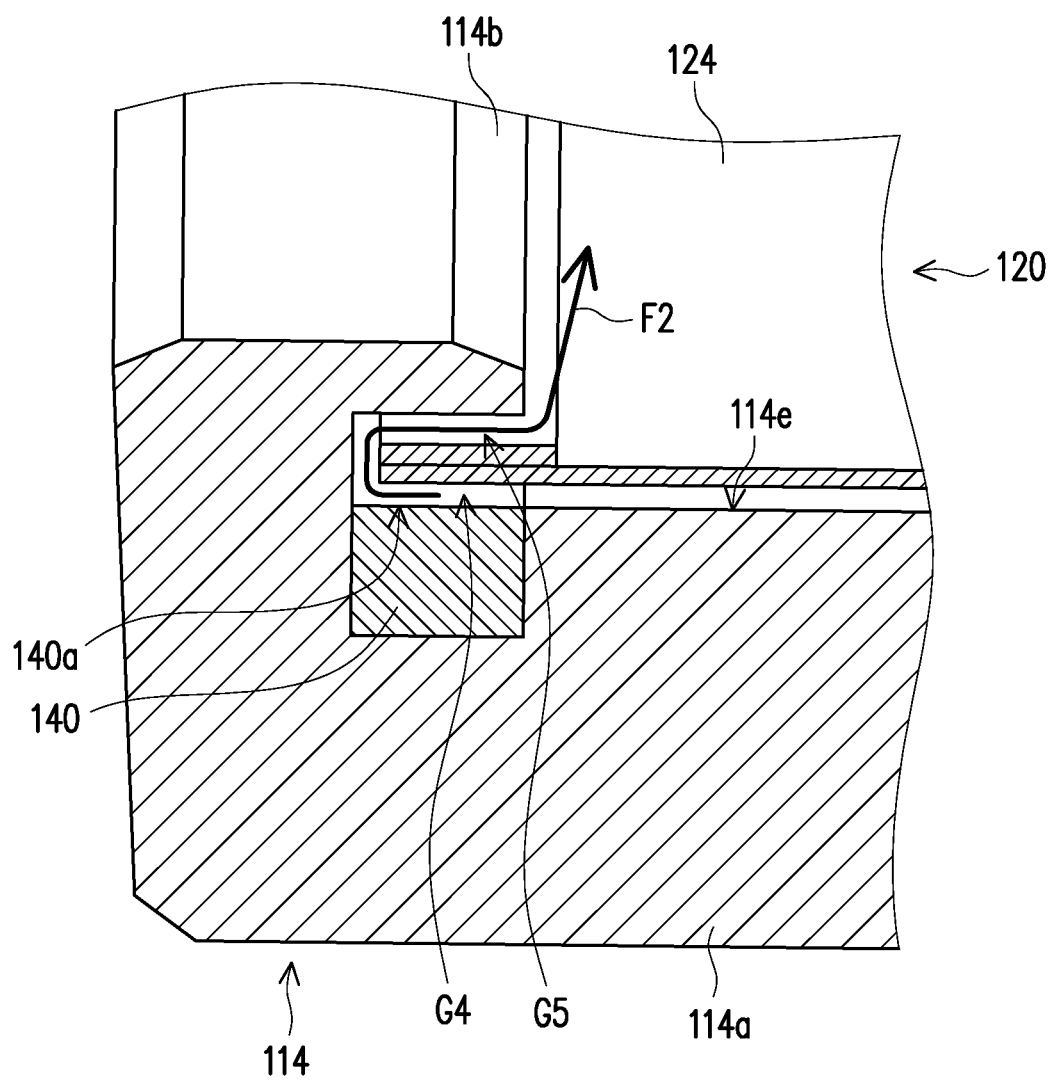
FIG. 9 illustrates a partial structure of the display device in FIG. 1.

FIG. 8 illustrates a partial structure of the display device in FIG. 1, in which a cross-section corresponds to an II-II line in FIG. 1. FIG. 9 illustrates a partial structure of the display device in FIG. 1, in which a cross-section corresponds to an III-III line in FIG. 1. As shown in FIG. 8, a gap G2 is formed between a partial peripheral edge of the flexible display panel 120 and the main body 112a of the body 112, and a gap G3 is formed between the partial peripheral edge of the flexible display panel 120 and the position limiting flange 112b of the body 112. Similarly, as shown in FIG. 9, a gap G4 is formed between the partial peripheral edge of the flexible display panel 120 and the main body 114a of the body 114, and a gap G5 is formed between the partial peripheral edge of the flexible display panel 120 and the position limiting flange 114b of the body 114. Moreover, in the embodiment, the first section 122 of the flexible display panel 120 is, for example, fixed to the body 112, and in order to allow the two bodies 112 and 114 and the flexible display panel 120 to be smoothly unfolded and folded, the flexible display panel 120 and the other body 114 is, for example, designed to be relatively slidable, so that while the two bodies 112 and 114 are relatively unfolded or folded, friction is generated between a peripheral edge of the flexible display panel 120 and the main body 114a and the position limiting flange 114b at the gaps G4 and G5.

In order to prevent dust and particles from being adsorbed and accumulated in the gap G2 between the flexible display panel 120 and the main body 112a and the gap G3 between the flexible display panel 120 and the position limiting flange 112b, and in order to prevent dust and particles from being largely adsorbed and accumulated in the gap G4 between the flexible display panel 120 and the main body 114a and in the gap G5 between the flexible display panel 120 and the position limiting flange 114b due to frictional static electricity between the peripheral edge of the flexible display panel 120 and the main body 114a and the position limiting flange 114b, the display device 100 of the embodiment further includes at least one fan 140 as shown in FIG. 8 and FIG. 9 (at least two fans are shown in FIG. 8 and FIG. 9). The two fans 140 are respectively embedded in the bodies 112 and 114 and located adjacent to carrying surfaces 112e and 114e of the bodies 112 and 114 facing the flexible display panel 120, and air outlets 140a of the two fans 140 are respectively located on the carrying surfaces 112e and 114e to respectively face the gaps G2, G3 and the gaps G4, G5, so that the gaps G2, G3 are located on a flow path of an airflow F2 generated by the corresponding fan 140 and the gaps G4, G5 are located on a flow path of the airflow F2 generated by the corresponding fan 140. Thereby, dust and particles are prevented from being accumulated in the gaps G2, G3, G4 and G5 through the static electricity elimination function and/or flow of the airflow F2, and even if dust and particles are already accumulated in the gaps G2, G3, G4 and G5, the dust and particles may be removed by the airflow F2.

In the embodiment, a grid-shaped open slot may be provided on the back surface 112f (indicated in FIG. 3) of the body 112 to serve as an air inlet of the corresponding fan 140, or the air inlet and the air outlet 140a of the fan 140 may all be set on the carrying surface 112e of the body 112, which is not limited by the disclosure. The air inlet of the fan 140 corresponding to the body 114 is also, for example, configured in a similar manner. In addition, each fan 140 is, for example, an ion fan, and is suitable for generating an airflow with ions, so as to effectively remove dust from the gaps G2, G3, G4 and G5 through the ions. However, the disclosure is not limited thereto, and the fan 140 may be any suitable form.

Figure 10:
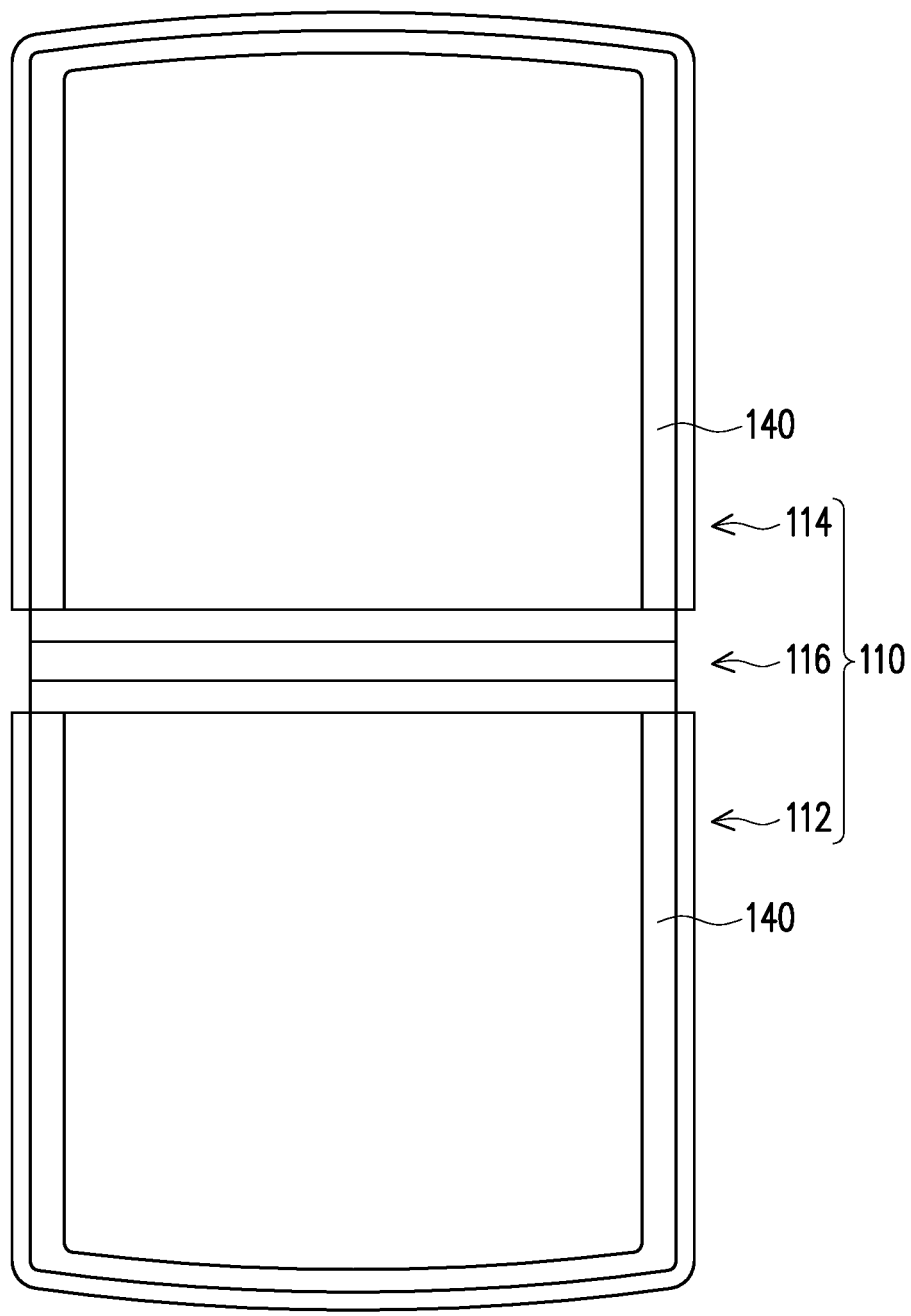
FIG. 10 schematically illustrates a distribution range of fans in FIG. 8 and FIG. 9.

FIG. 10 schematically illustrates a distribution range of the fans in FIG. 8 and FIG. 9. The two fans 140 of the embodiment may be configured to respectively extend along the peripheral edges of the bodies 112 and 114 as shown in FIG. 10, so as to completely cover ranges of the gaps G2, G3, G4 and G5 (indicated in FIG. 8 and FIG. 9). However, the disclosure is not limited thereto, each of the fans 140 may have a smaller distribution range.

For simplicity's sake, the fans 140 shown in FIG. 8 to FIG. 10 are not illustrated in FIG. 1 to FIG. 7. The display device 100 may be provided with the fans 130 and the fans 140 at the same time, or provided with the fans 130 without the fans 140, or provided with the fans 140 without the fans 130, which is not limited by the disclosure. Moreover, for simplicity's sake, in FIG. 8 and FIG. 9, locations of the air outlets 140a of the fans 140 are schematically indicated, but a specific structure of the air outlet 140a is not shown, and the air outlet 140a may actually be in a shape of an open slot or an open hole, which is not limited by the disclosure.

Besides that the display device 100 may be a smart phone or a tablet computer, in other embodiments, the display device 100 may also be an external display screen, a flat-screen television, etc., which is not limited by the disclosure. To be specific, the display device of the embodiment of the disclosure may be a 6-10 inches smart phone or tablet computer, a 14-32 inches display screen or a 32-85 inches flat-screen television.

Figure 11:
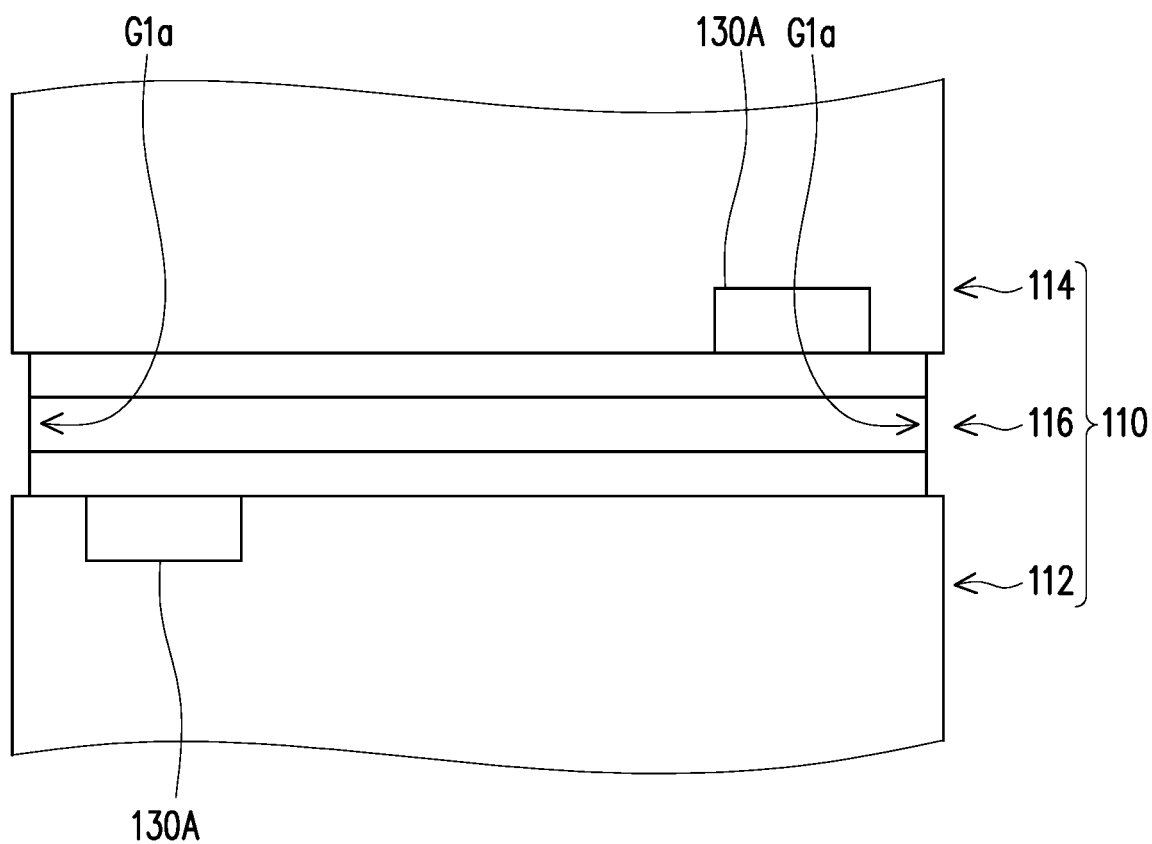
FIG. 11 is a partial structural schematic diagram of a display device according to another embodiment of the disclosure.
Figure 12:
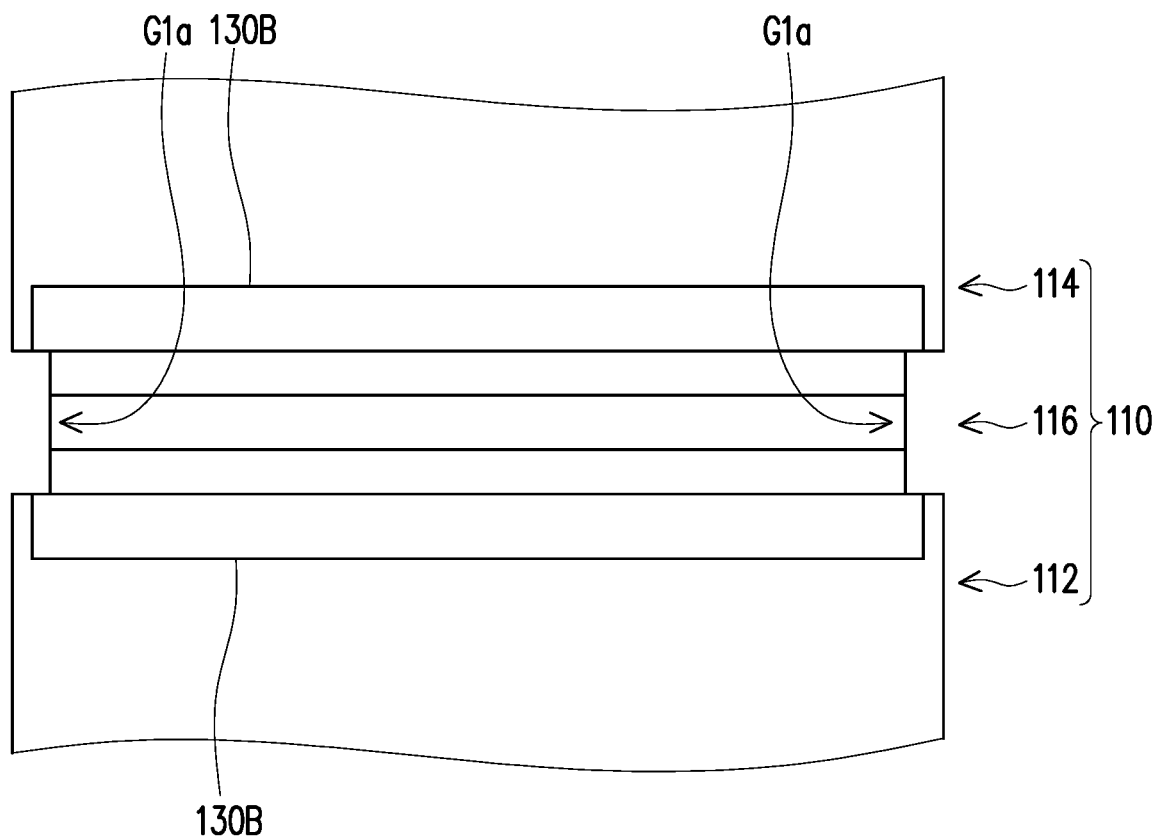
FIG. 12 is a partial structural schematic diagram of a display device according to another embodiment of the disclosure.

According to the display device of different sizes, the aforementioned fans 130 may have different configuration positions and distribution ranges, which will be described below with reference to the drawings. FIG. 11 is a partial structural schematic diagram of a display device according to another embodiment of the disclosure. A difference between the embodiment depicted in FIG. 11 and the embodiment shown in FIG. 6 is that the two fans 130A in FIG. 11 are configured to be respectively located adjacent to two opposite ends of the hinge 116, to respectively provide airflows to the two open ends G1a of the gap. This configuration method can be applied to a large-sized display device to avoid excessive increase of the manufacturing cost due to the fans with an excessively large distribution range. FIG. 12 is a partial structural schematic diagram of a display device according to another embodiment of the disclosure. A difference between the embodiment depicted in FIG. 12 and the embodiment depicted in FIG. 6 is that the fan 130B in FIG. 12 is configured to have a larger extending length to cover a range of the hinge 116. This configuration method may be applied to a display device with a smaller size. Both of the fan 130A shown in FIG. 11 and the fan 130B shown in FIG. 12 may be provided with an appropriate number of the airflow guiding structures 132 shown in FIG. 6 to guide the airflows to the two open ends G1a of the gap.

Figure 13:
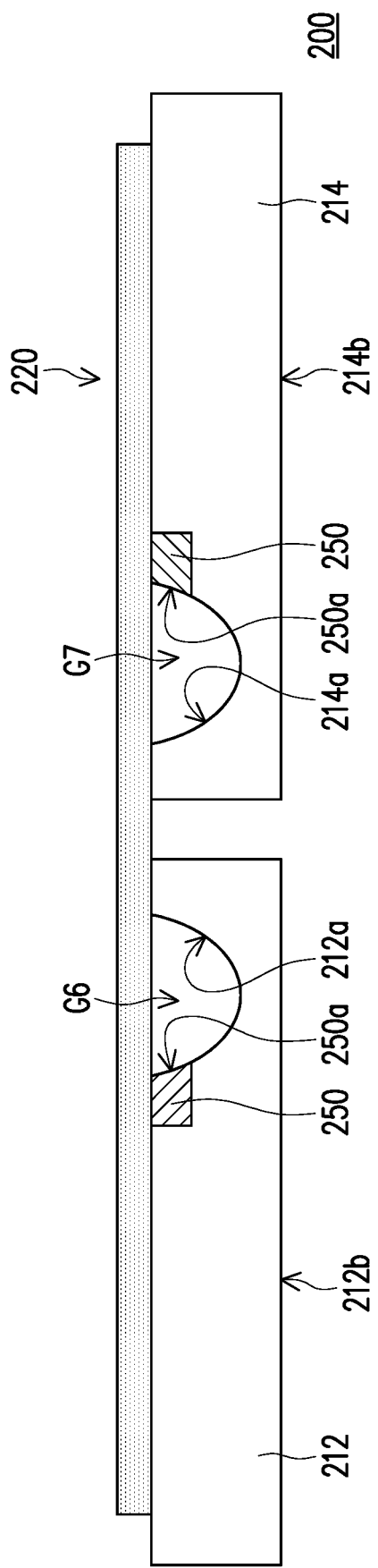
FIG. 13 is a cross-sectional schematic view of a display device according to another embodiment of the disclosure.
Figure 14:
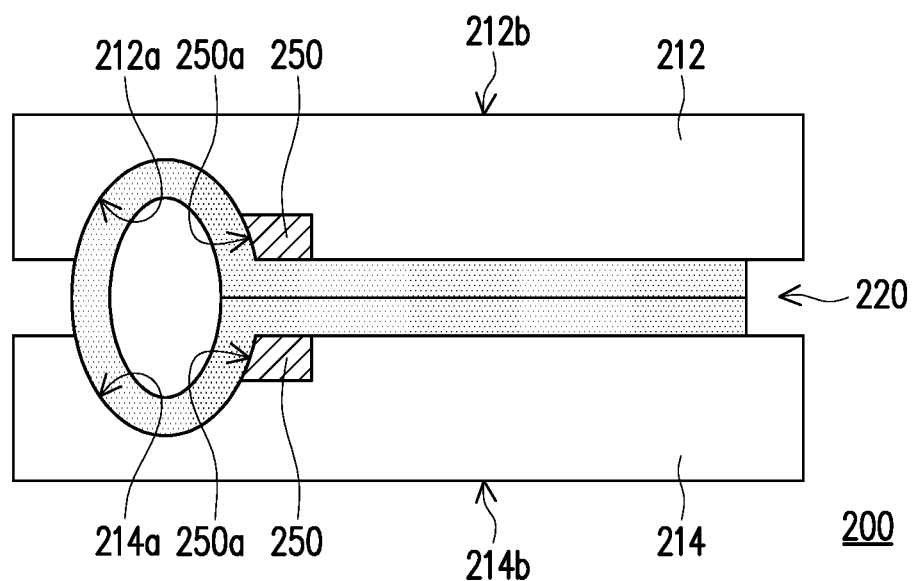
FIG. 14 illustrates a state of relatively folding the two bodies depicted in FIG. 13.

FIG. 13 is a cross-sectional schematic view of a display device according to another embodiment of the disclosure. FIG. 14 illustrates a state of relatively folding the two bodies depicted in FIG. 13. Configurations and functions of a body 212, a body 214, a flexible display panel 220 and other components of a display device 200 depicted in FIG. 13 and FIG. 14 are the same or similar to the configurations and functions of the body 112, the body 114, the flexible display panel 120 and other components of the aforementioned embodiment, and details thereof are not repeated. A difference between the embodiment shown in FIG. 13 and FIG. 14 and the aforementioned embodiment is that the body 212 has an accommodation recess 212a, and the body 214 has an accommodation recess 214a, the accommodation recesses 212a, 214a face the flexible display panel 220, so that a bending portion of the flexible display panel 220 folded between the two bodies 212, 214 may be located in the accommodation recesses 212a and 214a as shown in FIG. 14. The flexible display panel 220 and the accommodation recesses 212a and 214a have gaps G6 and G7 there between (indicated in FIG. 13).

In order to prevent dust and particles from being adsorbed and accumulated in the gaps G6 and G7 between the flexible display panel 220 and the accommodation recesses 212a and 214a, the display device 200 of the embodiment further includes at least one fan 250 (two fans are illustrated in FIG. 13 and FIG. 14). The two fans 250 are respectively embedded in the bodies 212 and 214 and located adjacent to the accommodation recesses 212a and 214a, and air outlets 250a of the two fans 250 are respectively located on inner surfaces of the accommodation recesses 212a and 214a to respectively face the gaps G6 and G7, such that the airflows generated by the fans 250 prevent dust and particles from accumulating in the gaps G6 and G7, and even if dust and particles are already in the gaps G6 and G7, the dust and particles may be removed by the airflow.

In the embodiment, a grid-shaped open slot may be provided on a back surface 212f of the body 212 to serve as an air inlet of the corresponding fan 250, or the air inlet and the air outlet 250a of the fan 250 may all be set on the inner surface of the accommodation recesses 212a, which is not limited by the disclosure. Similarly, a grid-shaped open slot may be provided on a back surface 214f of the body 214 to serve as an air inlet of the corresponding fan 250, or the air inlet and the air outlet 250a of the fan 250 may all be set on the inner surface of the accommodation recesses 214a, which is not limited by the disclosure. Moreover, each fan 250 is, for example, an ion fan, and is suitable for generating an airflow with ions, so as to efficiently remove dust and particles from the gaps G6 and G7 by the ions. However, the disclosure is not limited thereto, and the fans 250 may be any suitable form.

Figure 15:
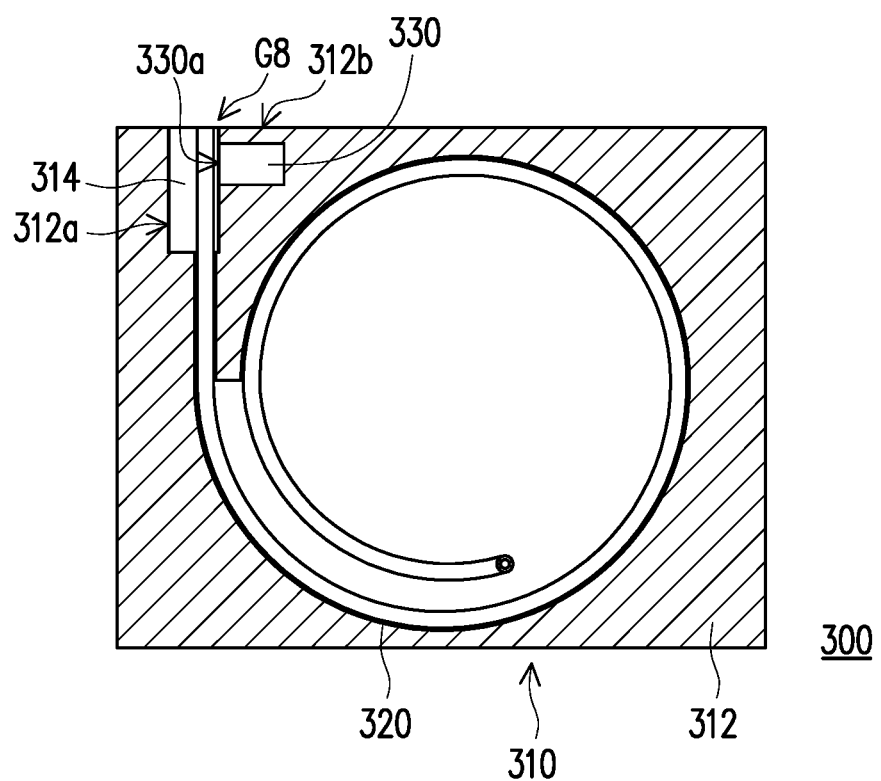
FIG. 15 is a cross-sectional schematic view of a display device according to another embodiment of the disclosure.
Figure 16:
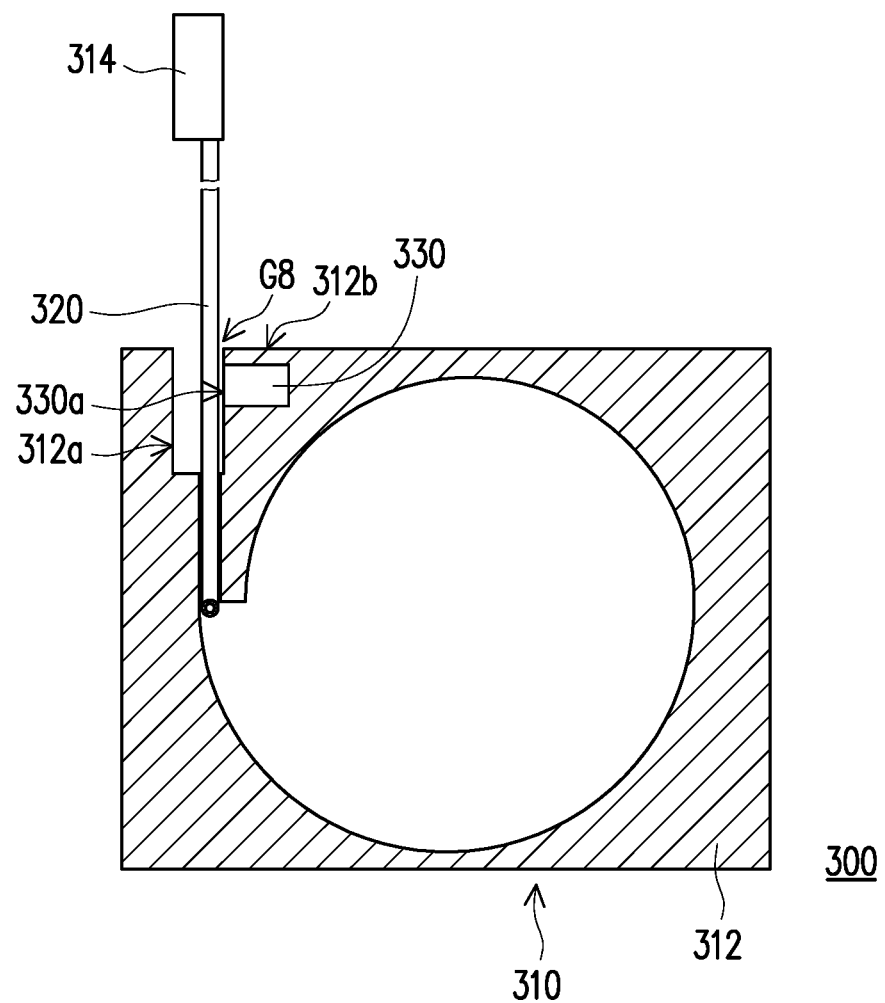
FIG. 16 illustrates a flexible display panel in FIG. 15 unfolded above a base.
Figure 17:
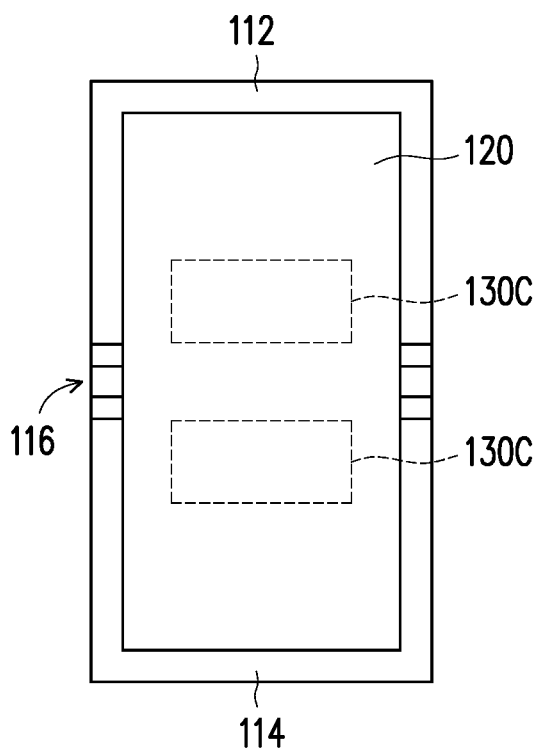
FIG. 17 to FIG. 20 are schematic diagrams of display devices according to other embodiments of the disclosure.
Figure 18:
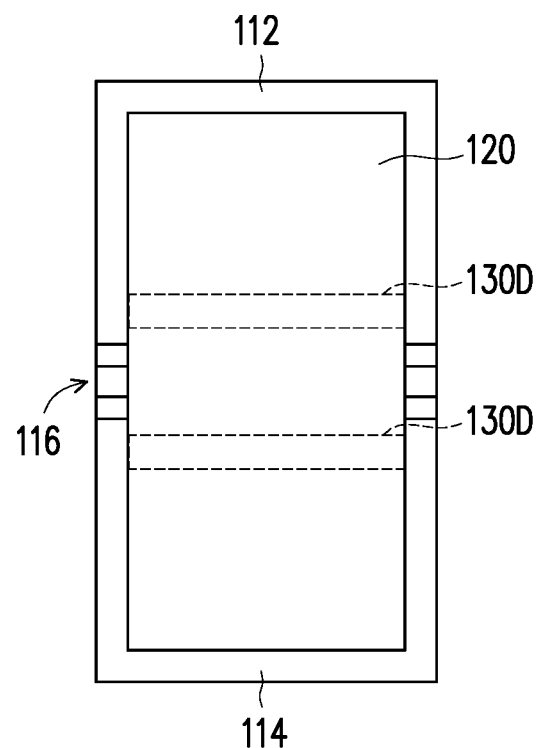
Figure 19:
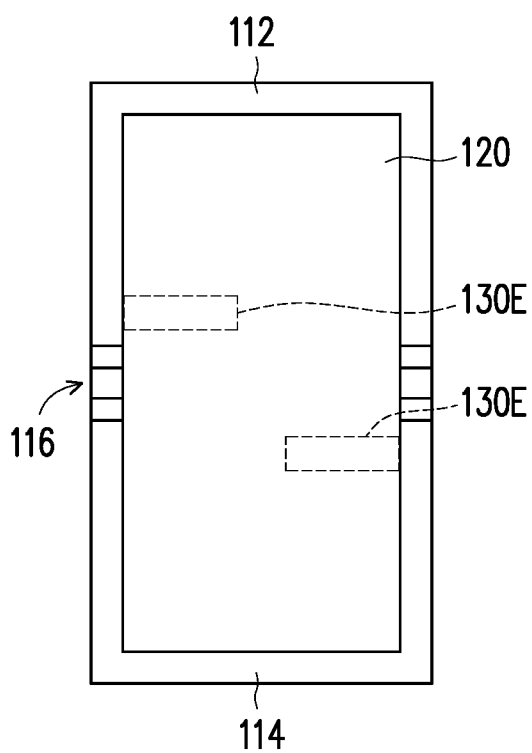
Figure 20:
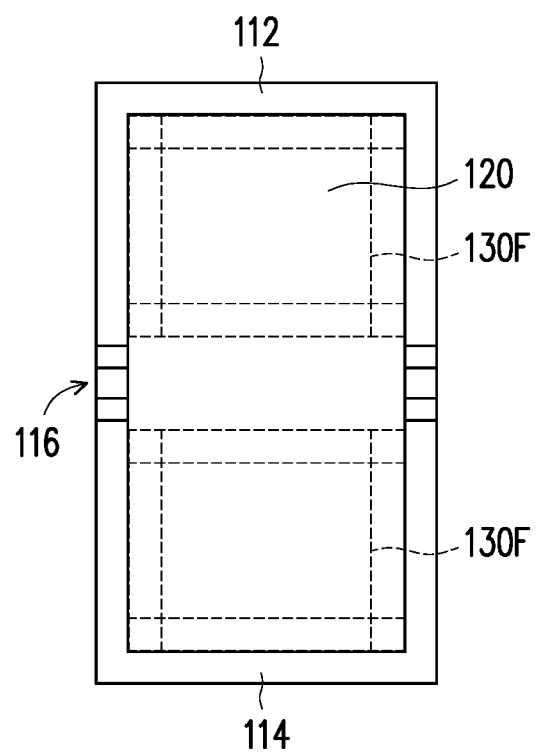

A display device implemented by a flat-screen television will be specifically described below with reference to the drawings. FIG. 15 is a cross-sectional schematic view of a display device according to another embodiment of the disclosure. FIG. 16 illustrates the flexible display panel of FIG. 15 unfolded above a base. A difference between a display device 300 depicted in FIG. 15 and FIG. 16 and the aforementioned embodiment is that a carrying main body 310 includes a base 312 and a lifting assembly 314, the lifting assembly 314 is disposed on the base 312 in a liftable manner, and two ends of the flexible display panel 320 are respectively connected to the base 312 and the lifting assembly 314. The flexible display panel 320 is adapted to be rolled up in the base 312 as shown in FIG. 15 or unfolded between the base 312 and the lifting assembly 314 as shown in FIG. 16 while the lifting assembly 314 ascends or descends relative to the base 312. In the embodiment, as shown in FIG. 16, when the flexible display panel 320 is in an unfolded state, at least one part of the lifting assembly 314 is not located in an open slot 312a of the carrying main body 310, but the disclosure is not limited thereto. The lifting assembly 314 may be driven to ascend and descend by any suitable driving mechanism, which is not limited by the disclosure. Moreover, one end of the flexible display panel 320 is adapted to be smoothly rolled up while the lifting assembly 314 descends through guidance of any suitable linkage mechanism in the base 312, but the disclosure is not limit thereto. In other variations, the lifting assembly 314 may not be located at an upper end of the flexible display panel 320, and the lifting assembly 314 may be located at at least one of a left side, a right side, and a back side of the flexible display panel 320 to guide the rolling-up operation or the unfolding operation of the flexible display panel 320. In such variation, when the flexible display panel 320 is in the unfolded state, the lifting assembly 314 is still located in the open slot 312a of the carrying main body 310 or in another accommodation space inside the carrying main body 310, but the disclosure is not limited thereto.

In the embodiment, the base 312 has the open slot 312a, and the flexible display panel 320 rolled up in the base 312 is adapted to move toward an outer space of the base 312 through the open slot 312a. There is a gap G8 between the flexible display panel 320 and an inner wall of the open slot 312a. In order to prevent dust and particles from being adsorbed and accumulated in the gap G8 between the flexible display panel 320 and the inner wall of the open slot 312a, the display device 300 of the embodiment includes at least one fan 330. The fan 330 is embedded in the base 312 and is located adjacent to the open slot 312a, and an air outlet 330a of the fan 330 is located on the inner wall of the open slot 312a and faces the gap G8. For example, the air outlet 330a of the fan 330 faces one part of the flexible display panel 320 located in the open slot 312a, such that the airflow generated by the fan 330 prevents dust and particles from accumulating in the gap G8, and even if dust and particles are already in the gap G8, the dust and particles may be removed by the airflow.

In the embodiment, a grid-shaped open slot may be provided on a top surface 312b of the base 312 to serve as an air inlet of the fan 330, or the air inlet and the air outlet 330a of the fan 330 may all be set on an inner surface of the open slot 312a, which is not limited by the disclosure. Moreover, the fan 330 is, for example, an ion fan, and is suitable for generating an airflow with ions, so as to effectively remove dust and particles from the gap G8 through the ions. However, the disclosure is not limited thereto, and the fan 330 may be any suitable form.

In terms of an implementation that the display device is a smart phone or a tablet computer, other configurations of the fan are described below with reference to the drawings. FIG. 17 to FIG. 20 are schematic diagrams of display devices according to other embodiments of the disclosure. As shown by fans 130C in FIG. 17, fans 130D in FIG. 18, or fans 130E in FIG. 19, each fan may be configured as a block fan of various sizes and distributions and located adjacent to the edge of the body 112 or 114 facing the hinge 116, or as shown by fans 130F in FIG. 20, each fan may be configured as a fan of a hollow square shape to extend along the peripheral edge of the body 112 or 114.

To sum up, the fan is configured with the air outlet facing the gap located between the flexible display panel and the carrying main body, so that the flow path of the airflow generated by the fan passes through the gap. Thereby, dust and particles are prevented from being accumulated in the gap through the airflow, and even if dust and particles are already accumulated in the gap, the dust and particles may be removed by the airflow. Therefore, the interior of the display device may be kept clean to prevent the flexible display panel from being scratched by dust and particles, and incapability of normally operating the display device due to accumulation of too much dust and particles inside the display device may be avoided.

It will be apparent to those skilled in the art that various modifications and variations can be made to the disclosed embodiment without departing from the scope or spirit of the disclosure. In view of the foregoing, it is intended that the disclosure covers modifications and variations provided that they fall within the scope of the following claims and their equivalents.

What is claimed is:

1. A display device, comprising:
a carrying main body;
a flexible display panel, disposed on the carrying main body and adapted to be unfolded on the carrying main body, wherein a gap is formed between the flexible display panel and the carrying main body; and
at least one fan, disposed on the carrying main body and adapted to generate an airflow, wherein a flow path of the airflow is located at the gap,
wherein the carrying main body comprises two bodies pivotally connected to each other, one part of the flexible display panel is arranged on one of the two bodies and the other part of the flexible display panel is arranged on the other one of the two bodies, and the flexible display panel is adapted to be unfolded while the two bodies are relatively unfolded and is adapted to be folded between the two bodies as the two bodies are relatively folded.

2. The display device according to claim 1, wherein the carrying main body further comprises a hinge, the two bodies are pivotally connected to each other through the hinge, and the gap is at least partially formed between the flexible display panel and the hinge.

3. The display device according to claim 2, wherein a side surface of each of the two bodies faces the hinge, the at least one fan is disposed on at least one of the two bodies, and an air outlet of the at least one fan is located on the side surface.

4. The display device according to claim 3, wherein the gap has at least one open end at at least one axial end of the hinge, the at least one open end communicates with an external space of the display device, the at least one fan comprises at least one airflow guiding structure, and an airflow guiding direction of the airflow guiding structure is toward the at least one open end.

5. The display device according to claim 1, wherein each of the bodies comprises a main body and a position limiting flange, the position limiting flange extends along a partial peripheral edge of the main body, a partial peripheral edge of the flexible display panel is limited between the position limiting flange and the main body, and the gap is at least partially formed between the partial peripheral edge of the flexible display panel and the main body and between the partial peripheral edge of the flexible display panel and the position limiting flange.

6. The display device according to claim 5, wherein each of the bodies has a carrying surface, the carrying surface faces the flexible display panel, the at least one fan is disposed on at least one of the two bodies, and an air outlet of the at least one fan is located on the carrying surface and corresponds to the partial peripheral edge of the flexible display panel.

7. The display device according to claim 1, wherein each of the bodies has an accommodation recess, the accommodation recess faces the flexible display panel, the flexible display panel folded between the two bodies is partially located in the accommodation recess, and the gap is at least partially formed between the flexible display panel and the accommodation recess.

8. A display device, comprising:
a carrying main body;
a flexible display panel, disposed on the carrying main body and adapted to be unfolded on the carrying main body, wherein a gap is formed between the flexible display panel and the carrying main body; and
at least one fan, disposed on the carrying main body and adapted to generate an airflow, wherein a flow path of the airflow is located at the gap,
wherein the carrying main body comprises a base and a lifting assembly, the lifting assembly is disposed on the base in a liftable manner, two ends of the flexible display panel are respectively connected to the base and the lifting assembly, the flexible display panel is adapted to be rolled up in the base or unfolded between the base and the lifting assembly while the lifting assembly ascends or descends relative to the base, the base has an open slot, the flexible display panel rolled up in the base is adapted to move toward an external space of the base through the open slot, and the gap is at least partially formed between the flexible display panel and an inner wall of the open slot.

9. The display device according to claim 1, wherein the fan is an ion fan.

10. A display device, comprising:
a carrying main body;
a flexible display panel, disposed on the carrying main body and adapted to be unfolded on the carrying main body, wherein a gap is formed between the flexible display panel and the carrying main body; and at least one fan, disposed on the carrying main body, wherein an air outlet of the at least one fan faces the gap, wherein the carrying main body comprises two bodies pivotally connected to each other, one part of the flexible display panel is arranged on one of the two bodies, and the other part of the flexible display panel is arranged on the other one of the two bodies.

11. The display device according to claim 10, wherein the carrying main body further comprises a hinge, the two bodies are pivotally connected to each other through the hinge, and the gap is at least partially formed between the flexible display panel and the hinge.

12. The display device according to claim 11, wherein a side surface of each of the two bodies faces the hinge, the at least one fan is disposed on at least one of the two bodies, and the air outlet of the at least one fan is located on the side surface.

13. The display device according to claim 12, wherein the gap has at least one open end at at least one axial end of the hinge, the at least one open end communicates with an external space of the display device, the at least one fan comprises at least one airflow guiding structure, and an airflow guiding direction of the airflow guiding structure is toward the at least one open end.

14. The display device according to claim 10, wherein each of the bodies comprises a main body and a position limiting flange, the position limiting flange extends along a partial peripheral edge of the main body, a partial peripheral edge of the flexible display panel is limited between the position limiting flange and the main body, and the gap is at least partially formed between the partial peripheral edge of the flexible display panel and the main body and between the partial peripheral edge of the flexible display panel and the position limiting flange.

15. The display device according to claim 14, wherein each of the bodies has a carrying surface, the carrying surface faces the flexible display panel, the at least one fan is disposed on at least one of the two bodies, and the air outlet of the at least one fan is located on the carrying surface and corresponds to the partial peripheral edge of the flexible display panel.

16. The display device according to claim 10, wherein each of the bodies has an accommodation recess, the accommodation recess faces the flexible display panel, the flexible display panel folded between the two bodies is partially located in the accommodation recess, and the gap is at least partially formed between the flexible display panel and the accommodation recess.

17. A display device, comprising:
a carrying main body;
a flexible display panel, disposed on the carrying main body and adapted to be unfolded on the carrying main body, wherein a gap is formed between the flexible display panel and the carrying main body; and
at least one fan, disposed on the carrying main body, wherein an air outlet of the at least one fan faces the gap,
wherein the carrying main body comprises a base and a lifting assembly, the lifting assembly is disposed on the base in a liftable manner, two ends of the flexible display panel are respectively connected to the base and the lifting assembly, the base has an open slot, and the gap is at least partially formed between the flexible display panel and an inner wall of the open slot.

18. The display device according to claim 10, wherein the fan is an ion fan.

* * * * *